(12) United States Patent
Minami et al.

(10) Patent No.: US 7,402,904 B2
(45) Date of Patent: Jul. 22, 2008

(54) SEMICONDUCTOR DEVICE HAVING WIRES THAT VARY IN WIRING PITCH

(75) Inventors: Toshifumi Minami, Yokohama (JP); Satoshi Oonuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 437 days.

(21) Appl. No.: 11/085,584

(22) Filed: Mar. 22, 2005

(65) Prior Publication Data
US 2006/0038292 A1    Feb. 23, 2006

(30) Foreign Application Priority Data
Aug. 23, 2004    (JP)    ............... 2004-242455

(51) Int. Cl.
*H01L 23/04*    (2006.01)
(52) U.S. Cl. .............. 257/698; 257/781; 257/784; 257/E23.174; 257/E23.07; 438/617; 438/618
(58) Field of Classification Search .............. 257/698, 257/784, 781, 668, 664; 438/617, 618, 106
See application file for complete search history.

(56) References Cited
U.S. PATENT DOCUMENTS 6,619,785 B1 * 9/2003 Sato ........................ 347/50
2006/0038292 A1    2/2006 Minami et al.

FOREIGN PATENT DOCUMENTS

| JP | 4-324956 | 11/1992 |
| JP | 8-279602 | 10/1996 |
| JP | 2002-329783 | 11/2002 |

OTHER PUBLICATIONS

U.S. Appl. No. 11/756,016, filed May 31, 2007, Saito.

* cited by examiner

*Primary Examiner*—Hsien-ming Lee
(74) *Attorney, Agent, or Firm*—Oblon, Spivak, McClelland, Maier & Neustadt, P.C.

(57) ABSTRACT

A semiconductor device includes a first wiring layer having a first wiring pitch and a second wiring layer having a second wiring pitch that differs from the first wiring pitch. The device further includes a third wiring layer which connects the first wiring layer and the second wiring layer and has a wiring incident angle of less than 45 degrees to at least the first wiring layer.

6 Claims, 9 Drawing Sheets

SEMICONDUCTOR DEVICE HAVING WIRES THAT VARY IN WIRING PITCH

CROSS-REFERENCE TO RELATED APPLICATIONS

This application is based upon and claims the benefit of priority from prior Japanese Patent Application No. 2004-242455, filed Aug. 23, 2004, the entire contents of which are incorporated herein by reference.

BACKGROUND OF THE INVENTION

1. Field of the Invention

The present invention relates to a semiconductor device having wires that vary in wiring pitch, or wires with a so-called pitch variation. More specifically, the invention relates to a semiconductor memory device including a storage element section and a control circuit section (passive circuit) to control the storage element section, which processes wires routed between the storage element section and the control circuit section whose specifications are reduced more than those of the storage element section.

2. Description of the Related Art

In recent years, the formation of wires at a light wavelength ($\lambda$) that is the limit of lithography has become essential to semiconductor devices as they increase in density and decrease in size. The following techniques can be adopted to bring a wiring pitch (line/space) close to the limit of lithography in forming wires: the diameter (N) of a lens is increased, an orbicular zone of a lens is used, a translucent mask (half-tone mask) is used, and a phase technology is used. With these techniques, wires can be formed theoretically at the limit of lithography to increase the density of semiconductor devices and decrease the size thereof.

In a peripheral device that controls a semiconductor memory device, especially a peripheral device that is formed simultaneously with a semiconductor memory device, the adoption of the above techniques causes the following phenomenon to appear easily. A wiring short (short circuit) is easy to occur due to a wire whose width is greater than a desired design value and so is a disconnection due to a wire whose width is less than the design value. This phenomenon can be avoided by digitalizing both an optical proximity effect and a wiring processing error in manufacturing a mask and then correcting data of a wiring pattern on the mask (e.g., optical proximity correction, which will be referred to as OPC hereinafter).

In semiconductor memory devices, however, it is very difficult to route wires with pitch variations between a cell of a storage element section and a control circuit section of a decoder, a sense amplifier and the like.

A cell and a control circuit section usually differ in wiring pitch. The reason is as follows. The cell is formed at, e.g., a cell pitch of a processing limit pitch, while the control circuit section is reduced in specifications (design rules) more than the cell and formed at, e.g., a peripheral circuit pitch which is broader than the processing limit pitch. Wires with pitch variations therefore need to be routed between the cell and the control circuit section. In order to increase the density of a semiconductor memory device, the pitch-variation wiring length of wires 101 (the length of oblique leading wires 101*a* that connect wires 101*b* toward a cell 103 and wires 101*c* toward a control circuit section 105) need to be minimized as shown in FIG. 11. The wires 101*a* should be formed such that their wiring incident angle to the wires 101*b* is 45 degrees (referred to as 45-degree oblique leading wires hereinafter). This technique has been proposed (see Jpn. Pat. Appln. KOKAI Publication No. 2002-329783, for example).

The above routing of wires 101 with pitch variations between the cell 103 and control circuit section 105 is greatly influenced by an optical proximity effect at the time of lithography. This influence becomes larger especially near the connection nodes of the wires 101*b* and the 45-degree oblique leading wires 101*a*. As is apparent from the results 102 of processing simulation shown in FIG. 12, the wires 101*b* toward the cell 103 are partly widened or narrowed more easily than the wires 101*c* toward the control circuit section 105. The partial variation in the width of the wires (distortion of the shape of the wires) causes a wiring short or a disconnection in some cases and thus decreases the productivity (yield) of semiconductor memory devices.

Conventionally, a wiring pattern 201 was subjected to OPC to unify the shapes of the wires 101 or the 45-degree oblique leading wires 101*a* were formed to increase in width more than the wires 101*b*. However, since an enormous amount of data has to be processed in order to form a wiring pattern in manufacturing a mask, it is difficult to do so completely automatically at the present time. In particular, much effort has to be required to form wires with a wiring incident angle other than those of 45-degree and 90-degree oblique leading wires because of constraints of computer aided drafting (referred to as CAD hereinafter).

BRIEF SUMMARY OF THE INVENTION

According to a first aspect of the present invention, there is provided a semiconductor device which comprises a first wiring layer having a first wiring pitch, a second wiring layer having a second wiring pitch that differs from the first wiring pitch, and a third wiring layer which connects the first wiring layer and the second wiring layer and has a wiring incident angle of less than 45 degrees to at least the first wiring layer.

According to a second aspect of the present invention, there is provided a semiconductor device which comprises a storage element section including a first wiring layer having a first wiring pitch, a control circuit section including a second wiring layer having a second wiring pitch that is broader than the first wiring pitch, the control circuit section controlling the storage element section, and a wiring section including a third wiring layer which is formed between the control circuit section and the storage element section to connect the first wiring layer and the second wiring layer, the third wiring layer having a wiring incident angle of less than 45 degrees to at least the first wiring layer.

According to a third aspect of the present invention, there is provided a semiconductor device having a wiring layer routed from a storage element section whose specifications are reduced to a limit to a control circuit section whose specifications are reduced more than the specifications of the storage element section, wherein the wiring layer includes a first wiring layer having a first wiring pitch of the storage element section, a second wiring layer having a second wiring pitch which is broader than the first wiring pitch, and a third wiring layer which connects the first wiring layer and the second wiring layer and has a wiring incident angle of less than 45 degrees to at least the first wiring layer.

DETAILED DESCRIPTION OF THE INVENTION

Embodiments of the present invention will be described with reference to the accompanying drawings.

First Embodiment

Figure 1:
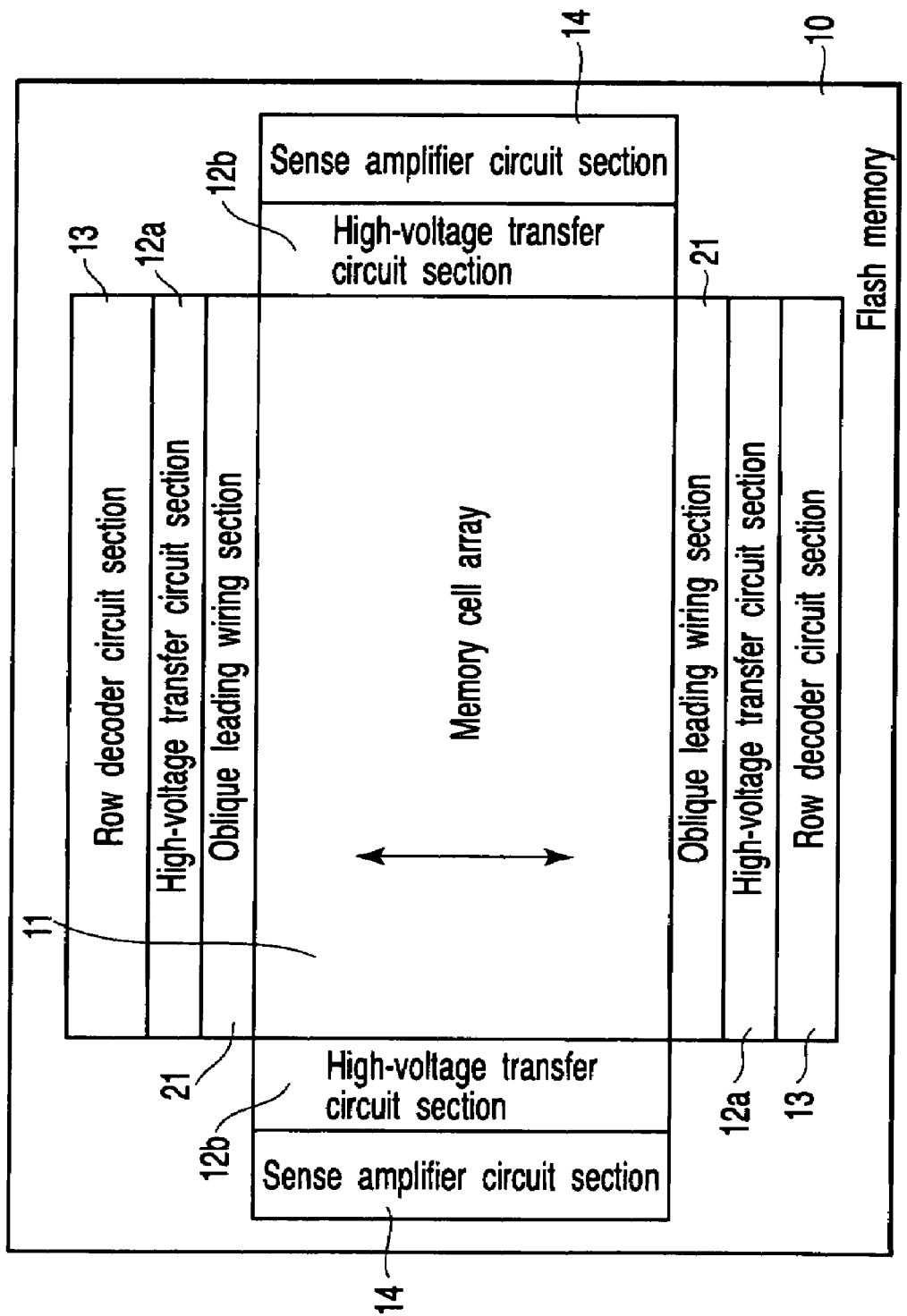
FIG. 1 is a layout sketch showing a semiconductor memory device (NAND type flash memory) according to a first embodiment of the present invention.

FIG. 1 shows a basic configuration of a semiconductor memory device according to a first embodiment of the present invention, which includes a storage element section and a control circuit section to control the storage element section. Specifically, FIG. 1 shows only the principal part of a NAND type flash memory 10 as an example of the semiconductor memory device. The first embodiment gives an explanation of routing of wires that vary in pitch between a memory cell array and a row decoder circuit section that differ in wiring pitch.

Referring to FIG. 1, the NAND type flash memory 10 includes a memory cell array (storage element section) 11. A row decoder circuit section (control circuit section) 13 is provided at either end of the memory cell array 11 in the directions that are perpendicular to the word lines (the directions of the double-headed arrow in FIG. 1) with a high-voltage transfer circuit section 12a therebetween. An oblique leading wiring section 21 (described later) is provided between each of the ends of the memory cell array 11 and the high-voltage transfer circuit section 12a.

On the other hand, a sense amplifier circuit section 14 is provided at either end of the memory cell array 11 in the directions of the word lines with a high-voltage transfer circuit section 12b therebetween. A column decoder (not shown) is connected to the sense amplifier circuit section 14. The sense amplifier circuit section 14 includes a plurality of sense amplifier circuits (not shown) that also serve as latch circuits to write and read data. The sense amplifier circuits are connected to their respective bit lines of the memory cell array 11.

The memory cell array 11 is formed at, e.g., a cell pitch of a processing limit pitch. In contrast, at least the row decoder circuit section 13 is reduced in specifications (design rules) more than the cell and formed at, e.g., a peripheral circuit pitch which is broader than the processing limit pitch. When the cell pitch is 90 nm, the peripheral circuit pitch is set at about 500 nm.

Figure 2:
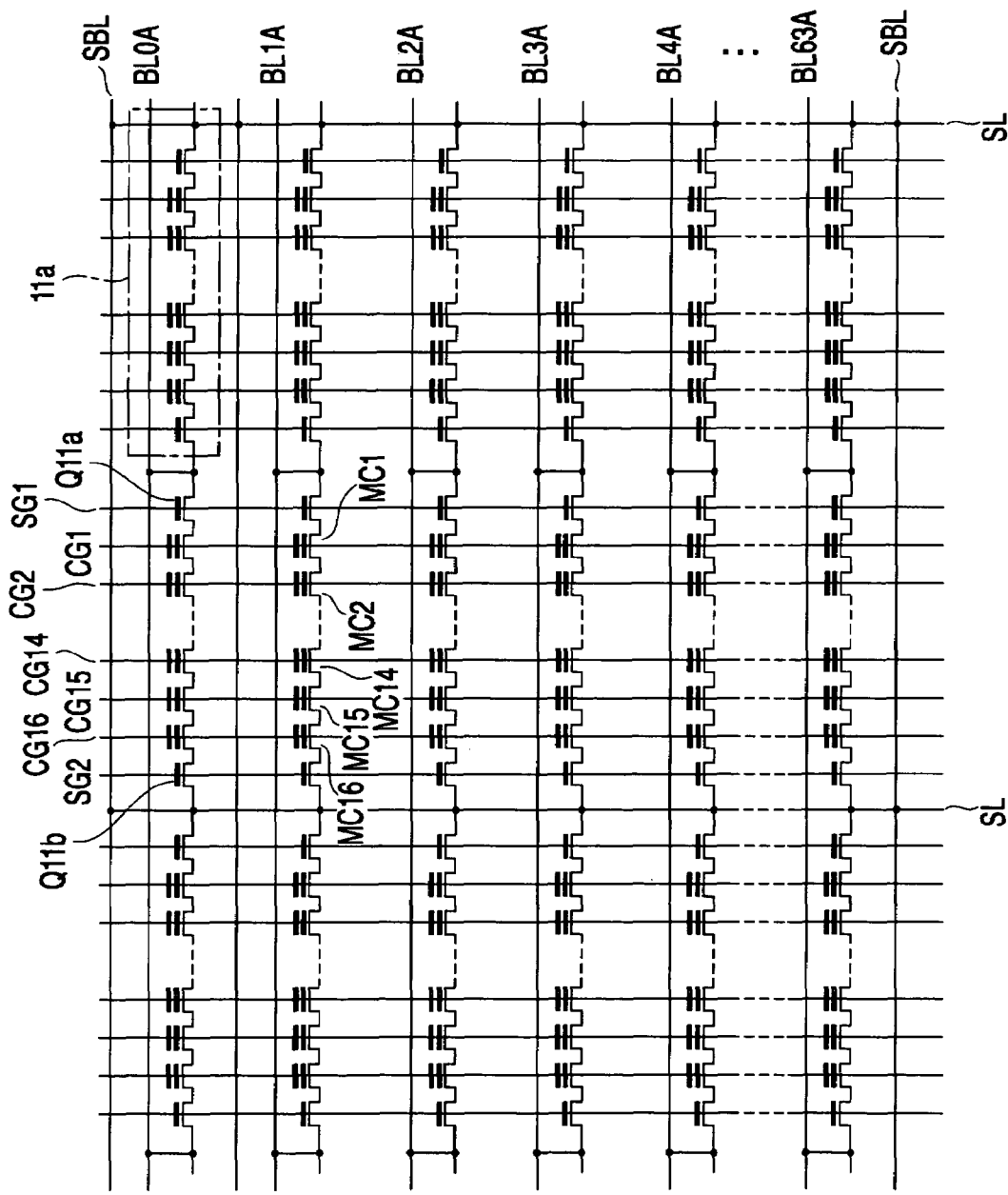
FIG. 2 is a diagram of a memory cell array of the NAND type flash memory shown in FIG. 1.

FIG. 2 shows an example of the arrangement of the memory cell array 11. The memory cell array 11 includes a plurality of NAND cells 11a. These NAND cells 11a are arranged in matrix or in row and column directions and each include, for example, sixteen memory cells MC1 to MC16 and first and second select gate transistors Q11a and Q11b. The first select gate transistor Q11a of each of the NAND cells 11a is connected to any one of bit lines BL0A to BL63A arranged in the column direction. The second select gate transistor Q11b of each of the NAND cells 11a is connected to any one of source lines SL arranged in the row direction. Each of the source lines SL is connected to source bias lines SBL through contacts. The source bias lines SBL are arranged in the column direction for every sixty-four bit lines and made of aluminum or polysilicon. The source bias lines SBL are connected to a source line bias circuit (not shown).

In FIG. 2, reference symbols and numerals CG1 to CG16 represent control gate lines (word lines) of the memory cells MC1 to MC16, while SG1 and SG2 indicate select gate lines of the first and second select gate transistors Q11a and Q11b.

In the NAND type flash memory of the first embodiment, one page includes memory cells of, e.g., 528 bytes (=data storage section of 512 bytes+redundancy section of 16 bytes). Data is written/read to/from memory cells of one page almost at the same time. One block includes memory cells of 16 Kbytes+0.5 Kbyte (K is 1024). Data is erased from memory cells of one block almost at the same time.

Figure 3A:
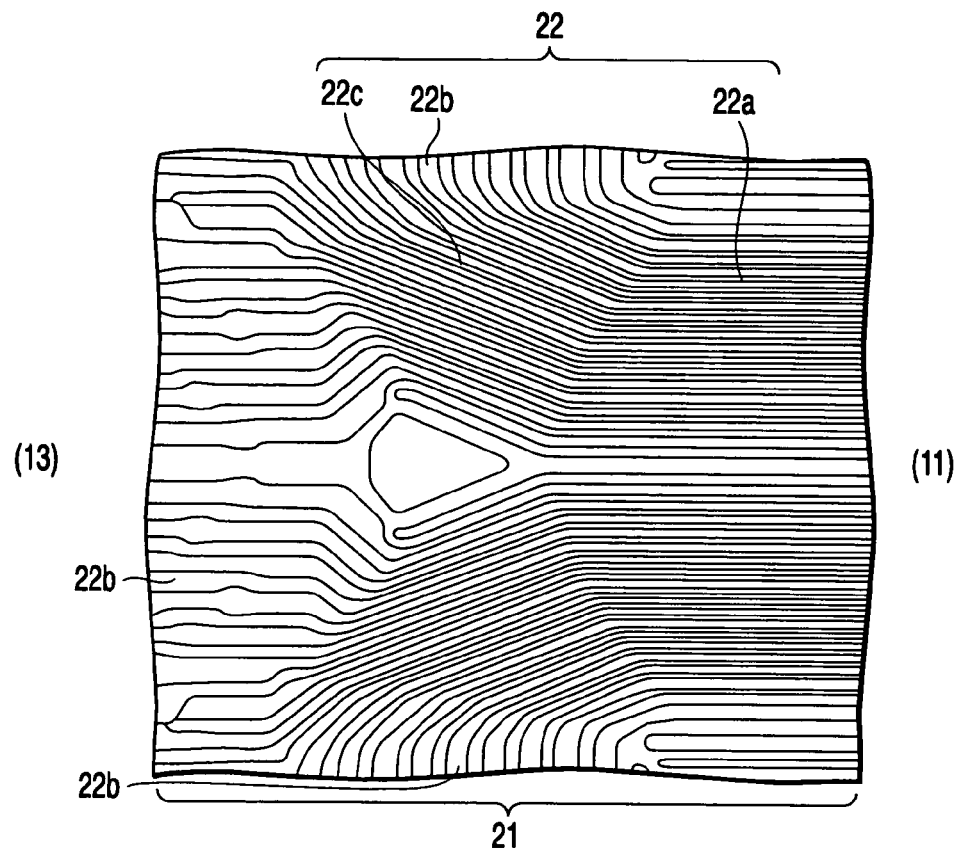
FIGS. 3A and 3B are diagrams of an oblique leading wiring section of the NAND type flash memory shown in FIG. 1.
Figure 3B:
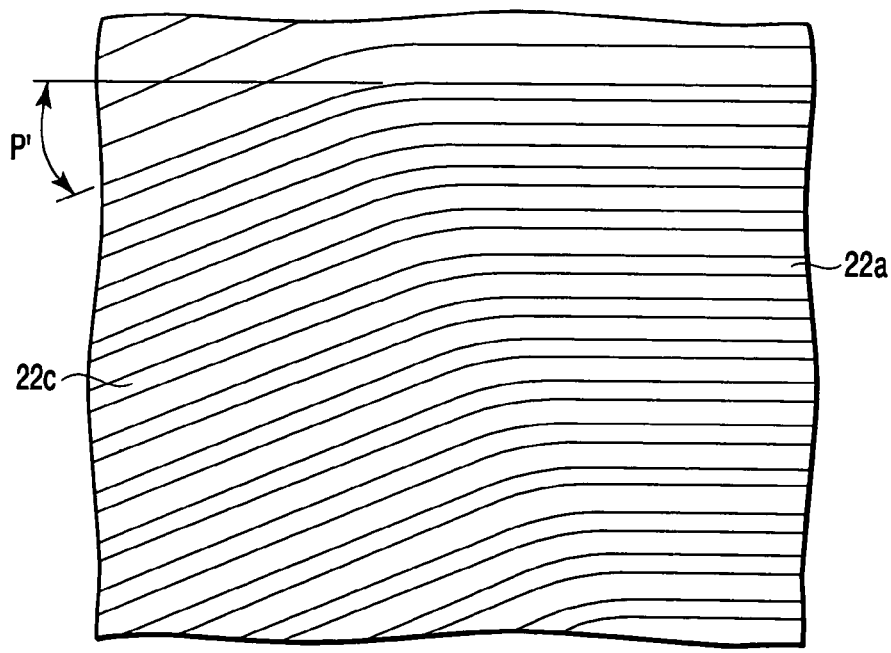

FIGS. 3A and 3B illustrate an example of the arrangement of the oblique leading wiring section 21 described above. FIG. 3A is a plan view of the oblique leading wiring section and FIG. 3B is an enlarged view of the main part of the section shown in FIG. 3A. In the first embodiment, 30-degree oblique leading wires are formed by the well-known lithography technology such that their wiring incident angle P' becomes 30 degrees.

Referring to FIG. 3A, the oblique leading wiring section 21 includes a plurality of wiring layers 22 with pitch variations, which are routed between the memory cell array 11 and the row decoder circuit section 13. Each of the wiring layers 22 has wires 22a and 22b that differ in wiring pitch and 30-degree oblique leading wires (third wiring layers) 22c. The wires 22a and 22b are connected to each other by the wires 22c. The wires 22c are laid out such that their incident angle P' to at least the wires 22a become 30 degrees.

The wires 22a correspond to the control gate lines (first wiring layers having a first wiring pitch) CG1 to CG16 of the memory cell array 11, which are formed at, e.g., a cell pitch. The wires 22b correspond to the signal lines (second wiring layers having a second wiring pitch) of the high-voltage transfer circuit section 12a connected to the row decoder circuit section 13, which are formed at, e.g., a peripheral circuit pitch.

When the wiring incident angle P' of the 30-degree oblique leading wires 22c to the wires 22a is 30 degrees, the influence of the optical proximity effect can be reduced at the time of lithography. The wires can thus be prevented from being distorted as shown in FIG. 3B and consequently the wiring layers 22 can be prevented from being disconnected or short-circuited. The wiring pitch (F/F') of the 30-degree oblique leading wires 22c can be set equal to that of the wires 22a, which is the processing limit pitch of a lithography apparatus.

Figure 4:
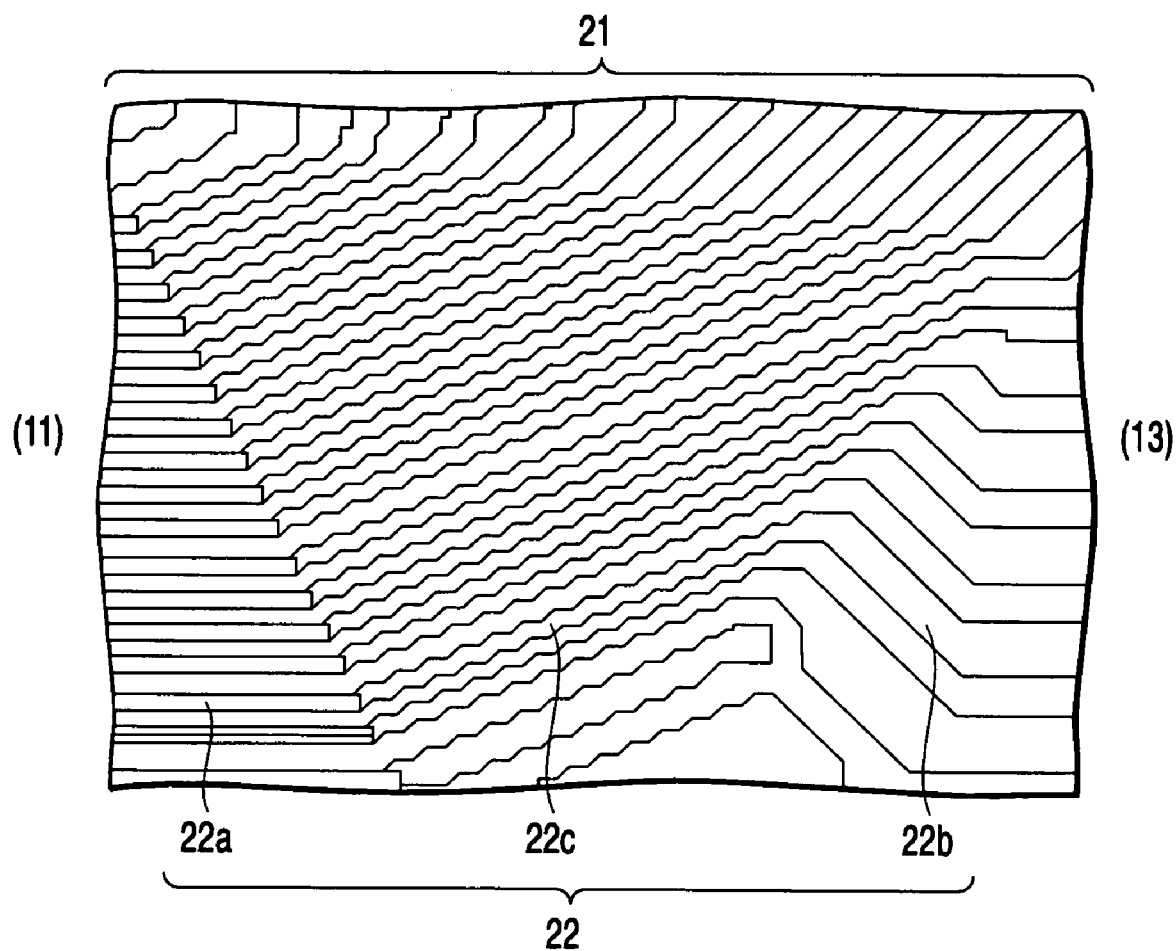
FIG. 4 is a diagram showing an example of 30-degree oblique leading wires in the oblique leading wiring section shown in FIG. 3.

The 30-degree oblique leading wires 22c can be formed stepwise as illustrated in FIG. 4. In other words, the 30-degree oblique leading wires 22c can be achieved by a stepwise wiring pattern.

Figure 5:
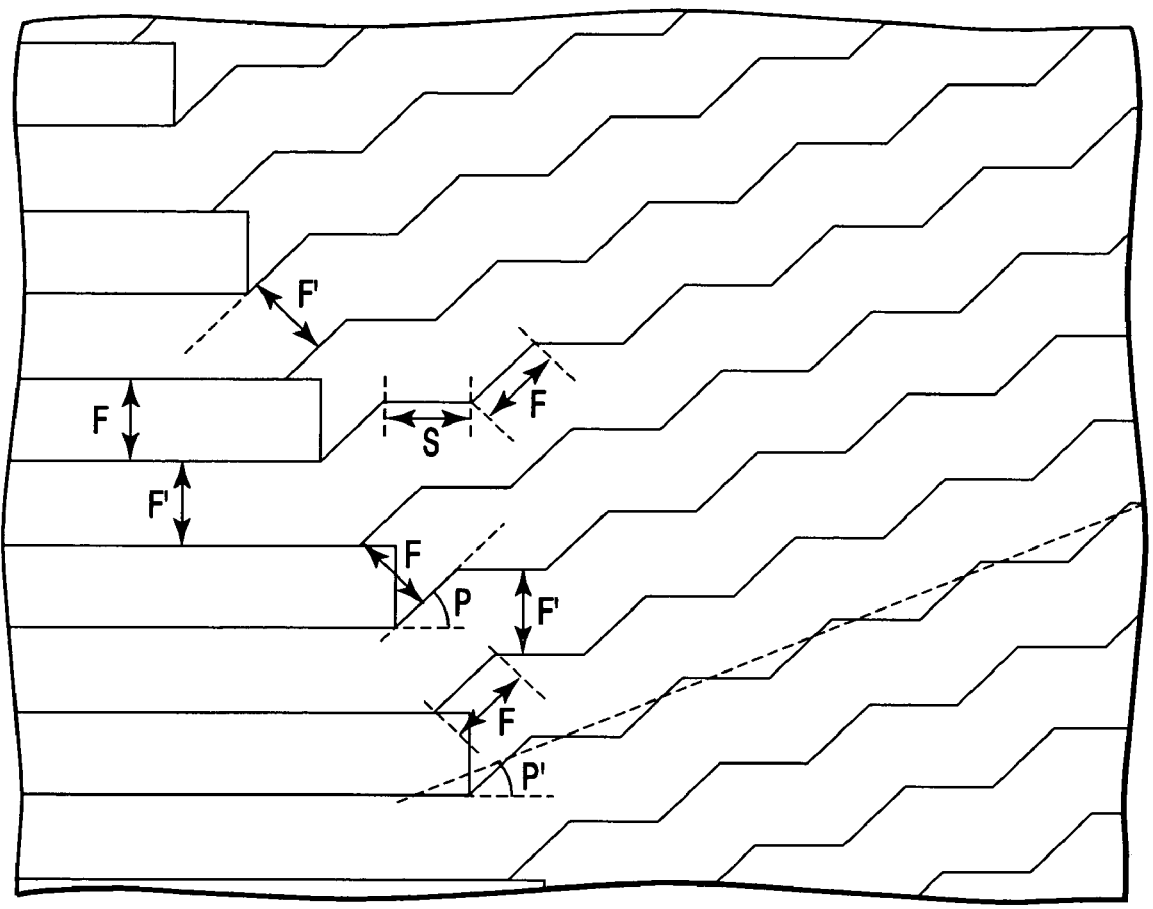
FIG. 5 is a diagram showing an example of a wiring pattern to explain a method of laying out 30-degree oblique leading wires.

A method of automatically laying out the above wiring layers 22 with pitch variations by CAD will be described. This method will be done taking the 30-degree oblique leading wires 22c as an example. A wiring pattern 31 is automatically formed on a mask in order to lay out the 30-degree oblique leading wires 22c by CAD using values F, F' S, P and P' as parameters as shown in FIG. 5.

The value F is a parameter to determine the width of each of the 30-degree oblique leading wires (lines) 22c and the length of an oblique portion thereof. The value F' is a parameter to determine a pitch (space) between the 30-degree oblique leading wires 22c. The values F and F' each represent the same design rules as those of the wires 22a. The value S is a parameter to determine the length of a horizontal (lateral) portion of each of the wires 22c and equal to or larger than the value F ($S \geq F$). The value P is a parameter to determine the angle of the wires 22c to the wires 22a in the oblique direction and usually set at 45 degrees. The value P' is a parameter to determine the wiring incident angle P' of the wires 22c and satisfies predetermined conditions (e.g., $P' \propto 1/S$).

Since the stepwise wiring pattern 31 is automatically formed according to the setting of the parameters described above, the 30-degree oblique leading wires 22c can automatically be laid out. Since, moreover, the wiring pattern 31 can be formed by CAD with less effort than that in prior art, a complicated operation need not be performed or an enormous amount of data need not be processed. It is of course easy to form a wiring pattern in order to lay out wiring layers having an incident angle P', which differ from the 30-degree oblique leading wires 22c, in accordance with the setting of the parameters.

In the actual lithography, a processing simulation is conducted using the same parameters as those of the prior art.

According to the first embodiment, oblique leading wires whose wiring incident angle is 30 degrees (less than 45 degrees) can be formed without processing an enormous amount of data or performing a complicated operation, as described above. The influence of the optical proximity effect at the time of lithography, which distorts wires, can thus be reduced. Consequently, the wires with pitch variations can be prevented from being disconnected or short-circuited and thus easily routed.

Second Embodiment

Figure 6:
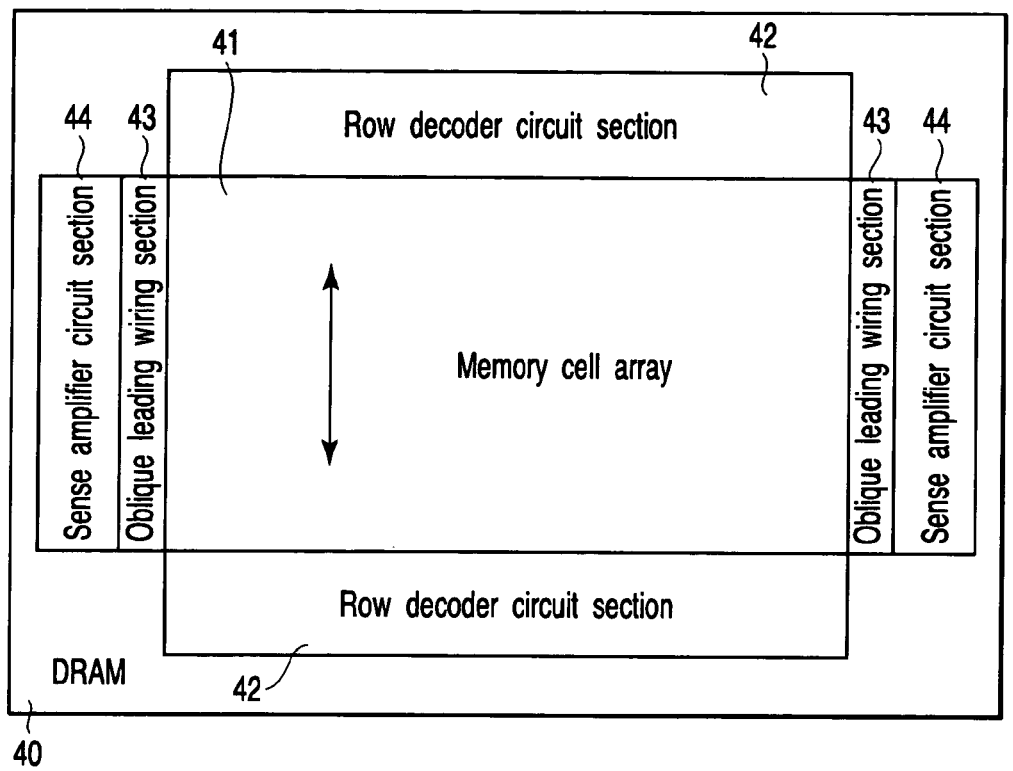
FIG. 6 is a layout sketch of a semiconductor memory device (DRAM) according to a second embodiment of the present invention.

FIG. 6 shows a basic configuration of a semiconductor memory device according to a second embodiment of the present invention, which includes a storage element section and a control circuit section to control the storage element section. Specifically, FIG. 6 shows only the principal part of a dynamic random access memory (hereinafter referred to as DRAM) 40 as an example of the semiconductor memory device. The second embodiment gives an explanation of routing of wires with pitch variations between a memory cell array and a sense amplifier circuit section that differ in wiring pitch.

Referring to FIG. 6, the DRAM 40 includes a memory cell array (storage element section) 41. A row decoder circuit section 42 is provided at either end of the memory cell array 41 in the directions that are perpendicular to the word lines (the directions of the double-headed arrow in FIG. 6).

On the other hand, a sense amplifier circuit section (control circuit section) 44 is provided at either end of the memory cell array 41 in the directions of the word lines with an oblique leading wiring section 43 (described later) therebetween. A column decoder (not shown) is connected to the sense amplifier circuit section 44. The sense amplifier circuit section 44 includes a plurality of sense amplifier circuits (not shown). The sense amplifier circuits are connected to their respective bit lines of the memory cell array 41.

The memory cell array 41 is formed at, e.g., a cell pitch of a limited process pitch. In contrast, at least the sense amplifier circuit section 44 is reduced in specifications (design rules) more than the cell and formed at, e.g., a peripheral circuit pitch which is broader than the processing limit pitch. When the cell pitch is 130 nm, the peripheral circuit pitch is set at 260 nm or more.

Figure 7:
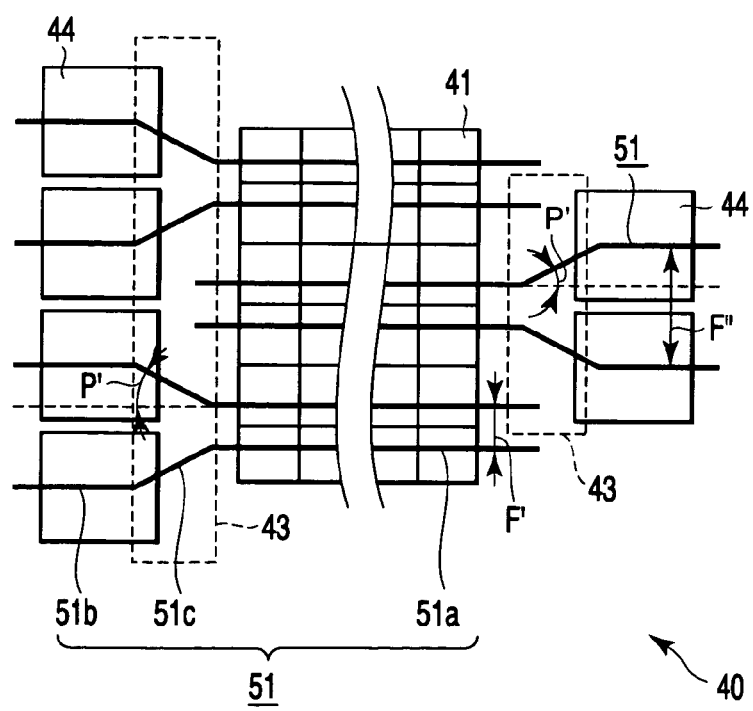
FIG. 7 is a diagram showing an example of routing of wires with pitch variations in the DRAM shown in FIG. 6.

FIG. 7 illustrates an example of wires with pitch variations, which are routed between the memory cell array 41 and the sense amplifier circuit section 44. For example, a plurality of wiring layers 51 are formed between the memory cell array 41 and the sense amplifier circuit section 44. In each of the wiring layers 51, wires (first wiring layers having a first wiring pitch) 51a toward the memory cell array 41 and wires (second wiring layers having a second wiring pitch) 51b toward the sense amplifier circuit section 44 are connected to each other by 30-degree oblique leading wires (third wiring layers) 51c of an oblique leading wiring section 43.

The 30-degree oblique leading wires 51c are laid out such that their incident angle P' to at least the wires 51a becomes 30 degrees as in the first embodiment.

The wires 51a correspond to bit lines of the memory cell array 41, which are formed at, e.g., a cell pitch (F'). The wires 51b correspond to signal lines of the sense amplifier circuit section 44, which are formed at, e.g., a peripheral circuit pitch (F" that is equal to or larger than 2F').

Figure 8:
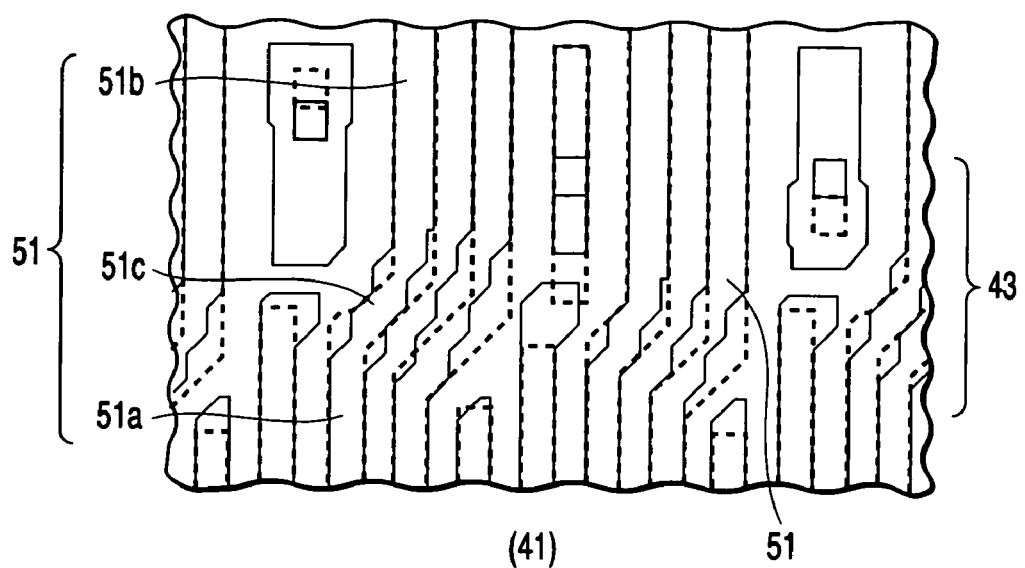
FIG. 8 is a diagram of an oblique leading wiring section of the DRAM shown in FIG. 6.

FIG. 8 illustrates an example of the arrangement of the oblique leading wiring section 43 described above. In the second embodiment, 30-degree oblique leading wires are laid out by the well-known lithography technology such that their incident angle becomes 30 degrees. In FIG. 8, the solid lines indicate the 30-degree oblique leading wires, while the broken lines indicate the trace of prior art 45-degree oblique leading wires.

The 30-degree oblique leading wires 51c to connect the wires 51a and 51b that differ in wiring pitch are formed stepwise. The 30-degree oblique leading wires 51c can thus be formed such that their incident angle to at least the wires 51a is 30 degrees.

In the DRAM 40, too, the incident angle P' of the 30-degree oblique leading wires 51c to the wires 51a can be set at 30 degrees (less than 45 degrees) to reduce the influence of the optical proximity effect at the time of lithography. The wires can thus be inhibited from being distorted and the wiring layers 51 can be prevented from being disconnected or short-circuited. The wires with pitch variations can easily be routed.

In the DRAM 40, the 30-degree oblique leading wires 51c are adopted to improve a margin of pattern transfer. The bit lines can thus easily be thinned and, in other words, the bit lines can be decreased in capacitance (CBL).

Figure 9A:
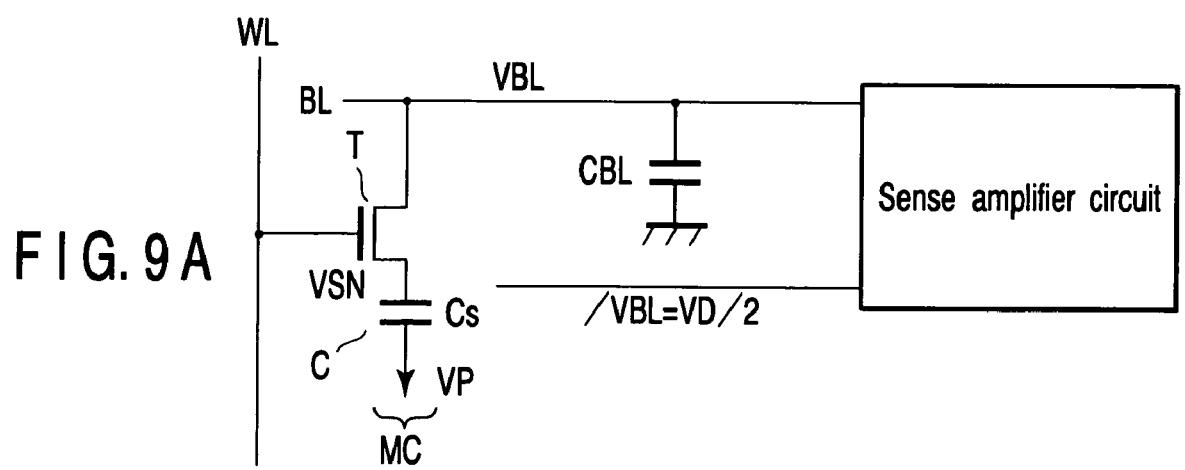
FIGS. 9A and 9B are diagrams illustrating an operation of a DRAM cell.
Figure 9B:
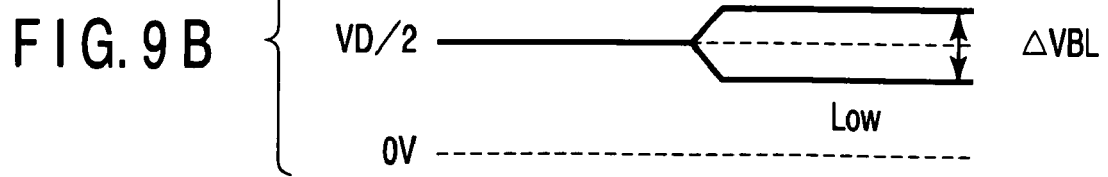

An operation of cells of the DRAM 40 will be described with reference to FIGS. 9A and 9B. Assuming that the source of a cell transistor T is at a high voltage VSN when data "1" is written to the cell capacitor C of a cell MC and also that the potential of a bit line BL is held at VBL, the total amount of charge QI stored in the cell MC and bit line BL is given as follows:

$$QI = Cs(VSN - VP) + CBL \cdot VBL \quad (1)$$

where Cs is the capacitance of the cell capacitor C, VP is the plate potential, and CBL is the total amount of parasitic capacitance of bit lines BL.

In the above state, the cell transistor T is turned on and the charge of the cell capacitor C is distributed again. Then, the source potential of the cell transistor T changes to VSN' and the potential of the bit line BL changes to VBL'. The plate potential VP is kept constant. The total amount of charge QF stored in the cell MC and bit line BL is expressed by the following equation:

$$QF = Cs(VSN'-VP) + CBL \cdot VBL' \qquad (2)$$

Since the amount of charge is maintained before and after the cell transistor T turns on, the relationship of "QI=QF" is established. Since, moreover, VSN' is equal to VBL' (VSN'=VBL') in the above equation (2), the following equation (3) is given:

$$VBL' = (Cs \cdot VSN + CBL \cdot VBL)/(Cs+CBL) \qquad (3)$$

The change of potential VBL of bit line BL is given by the following equation (4):

$$\Delta VBL = VBL' - VBL \qquad (4)$$
$$= (VSN - VBL)/(1 + CBL/Cs)$$

The bit line BL is precharged with VD/2. Thus, VSN becomes equal to VD and VBL becomes equal to VD/2. The above equation (4) is modified as follows:

$$\Delta VBL = VBL' - VBL \qquad (5)$$
$$= VD/\{2(1 + CBL/Cs)\}$$

The smaller the value "CBL/Cs," the greater the potential VBL of the bit line BL changes. In the DRAM 40, therefore, the adoption of 30-degree oblique leading wires 51c is very effective in reducing the capacitance CBL of the bit line BL.

Figure 10A:
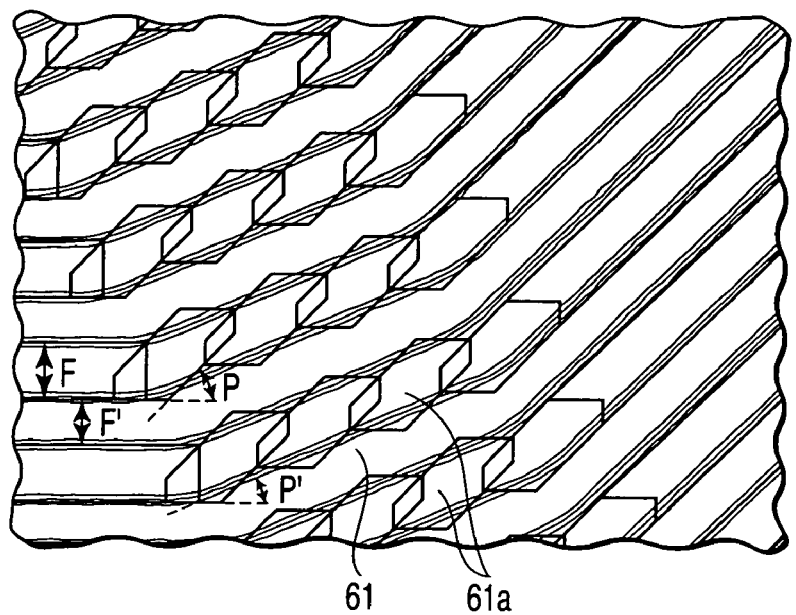
FIGS. 10A and 10B are diagrams showing another example of a wiring pattern to explain a method of laying out 30-degree oblique leading wires.
Figure 10B:
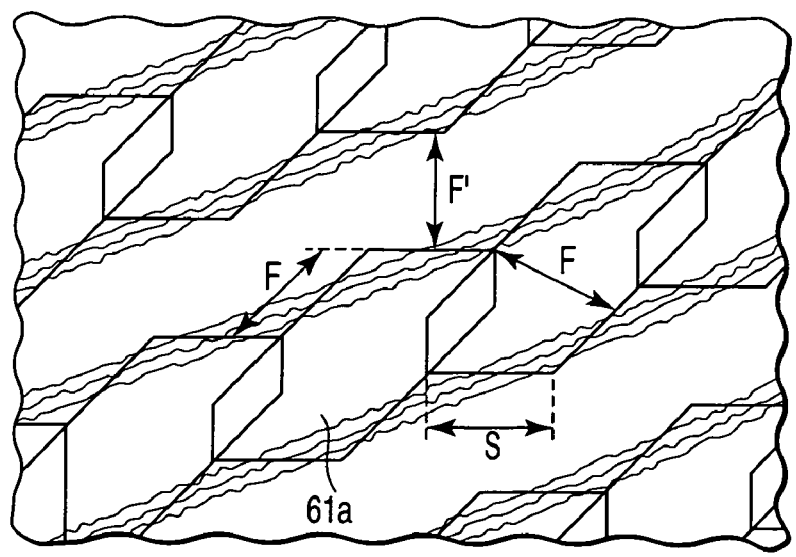
Figure 11:
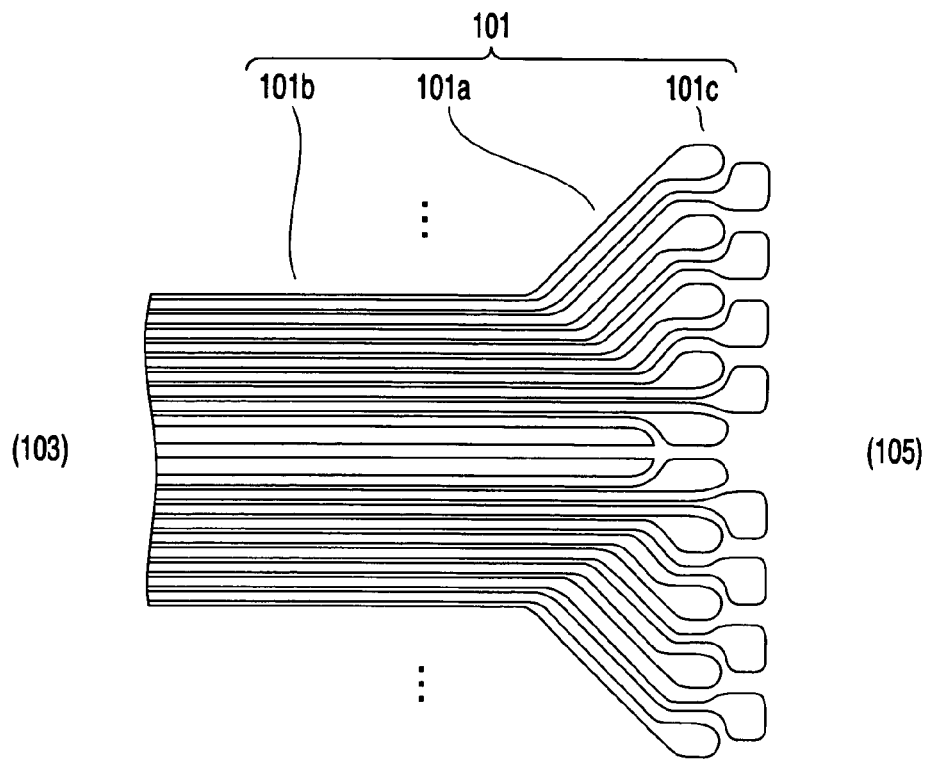
FIG. 11 is a diagram showing an example of prior art routing of wires with pitch variations.
Figure 12:
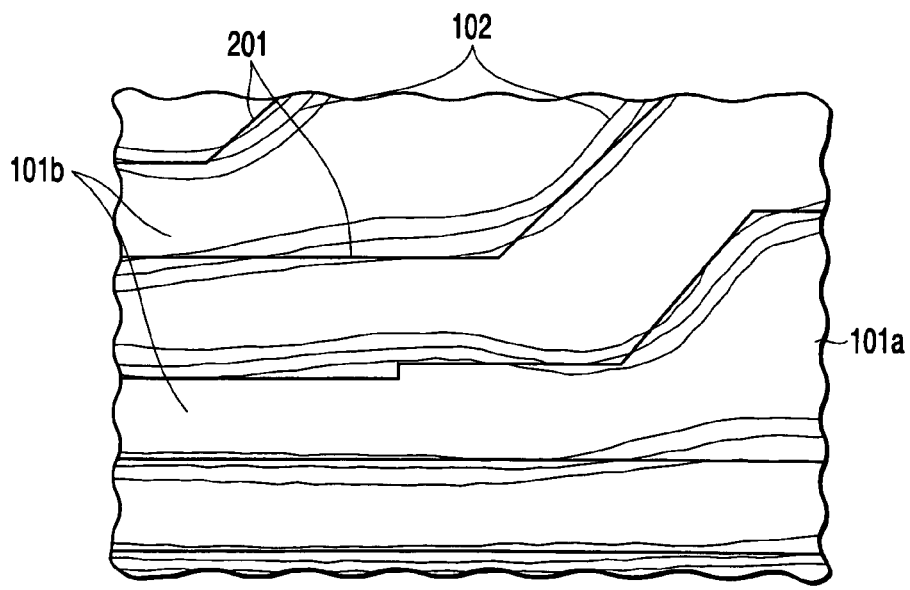
FIG. 12 is a partly enlarged view of wires with pitch variations to explain the problems of prior art.

In the first and second embodiments described above, the 30-degree oblique leading wires are laid out using parameters (values F, F', S, P and P'). The embodiments are not limited to this. For example, as shown in FIG. 10A, a plurality of block patterns 61a of the same size are formed stepwise at a given angle to form a wiring pattern 61 on a mask. The size and layout of the block patterns 61a is determined to satisfy the conditions (parameters) of the first embodiment, as illustrated in FIG. 10B. The 30-degree oblique leading wires can be formed even by the use of the wiring pattern 61.

In both the embodiments, the 30-degree oblique leading wires can easily be replaced with oblique leading wires whose incident angle P' is less than 45 degrees (0<P'<45).

In both the embodiments, wires are routed between the memory cell array and the row decoder circuit section and between the memory cell array and the sense amplifier circuit section. The embodiments are not limited to this. For example, the wires can be routed between a semiconductor memory device and a peripheral device that controls it or between a semiconductor memory device and a peripheral device that is formed simultaneously with it.

The embodiments can be applied to various types of semiconductor devices as well as a NAND type flash memory and a DRAM.

The embodiments can be applied to various types of oblique leading wires that are made of wiring materials of polymetal such as polysilicon and tungsten silicide and metal such as aluminum (Al) and copper (Cu).

In the embodiments, a plurality of oblique leading wires having the same wiring incident angle and a plurality of oblique leading wires having different incident angles can be formed together in a single wiring layer with pitch variations.

In the embodiments, one semiconductor device can include a plurality of wiring layers having oblique leading wires that differ in incident angle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a storage element section including a first wiring layer having a first wiring pitch;
    a control circuit section including a second wiring layer having a second wiring pitch that is broader than the first wiring pitch, the control circuit section controlling the storage element section; and
    a wiring section including a third wiring layer which is formed between the control circuit section and the storage element section to connect the first wiring layer and the second wiring layer, the third wiring layer having a wiring incident angle of less than 45 degrees to at least the first wiring layer.

2. The semiconductor device according to claim 1, wherein the third wiring layer is laid out to have a wiring incident angle of 30 degrees to the first wiring layer.

3. The semiconductor device according to claim 1, wherein the third wiring layer has a width which is equal to that of the first wiring layer.

4. The semiconductor device according to claim 1, wherein the third wiring layer is formed using a wiring pattern in which a plurality of block patterns of a same size are arranged stepwise at a predetermined angle.

5. The semiconductor device according to claim 1, wherein the storage element section is a memory cell array of a NAND type flash memory, and the control circuit section is a row decoder circuit section to control the memory cell array.

6. The semiconductor device according to claim 1, wherein the storage element section is a memory cell array of a dynamic random access memory (DRAM), and the control circuit section is a sense amplifier circuit section to control the memory cell array.

* * * * *